(12) United States Patent
Jung

(10) Patent No.: US 8,878,609 B2
(45) Date of Patent: Nov. 4, 2014

(54) DIFFERENTIAL AMPLIFIER CIRCUIT

(71) Applicant: SK Hynix Inc., Gyeonggi-do (KR)

(72) Inventor: Hae-Kang Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 8 days.

(21) Appl. No.: 13/717,536

(22) Filed: Dec. 17, 2012

(65) Prior Publication Data

US 2013/0328629 A1    Dec. 12, 2013

(30) Foreign Application Priority Data

Jun. 11, 2012  (KR) .................. 10-2012-0062122

(51) Int. Cl.
*H03F 3/45* (2006.01)

(52) U.S. Cl.
CPC .. *H03F 3/45071* (2013.01); *H03F 2203/45008* (2013.01); *H03F 3/45183* (2013.01); *H03F 2203/45702* (2013.01); *H03F 2203/45696* (2013.01); *H03F 3/4565* (2013.01)
USPC .......................................... 330/253; 330/258

(58) Field of Classification Search
CPC ............ H03F 3/45183; H03F 3/45659; H03F 3/45479; H03F 2203/45424; H03F 3/45475; H03F 1/3211; H03F 3/45071; H03F 1/34; H03F 1/083; H03F 3/45085; H03F 2203/45702
USPC .................................................. 330/252–261
See application file for complete search history.

(56) References Cited

U.S. PATENT DOCUMENTS 5,939,904 A * 8/1999 Fetterman et al. .............. 327/67

FOREIGN PATENT DOCUMENTS

KR    1019980012885    4/1998

OTHER PUBLICATIONS

Hamid Partovi et al., "Single-Ended Transceiver Design Techniques for 5.33Gb/s Graphics Applications," 2009 IEEE International Solid-State Circuits Conference, pp. 136-138, Feb. 10, 2009.

* cited by examiner

*Primary Examiner* — Hieu Nguyen
(74) *Attorney, Agent, or Firm* — IP & T Group LLP

(57) ABSTRACT

A differential amplifier circuit includes a differential amplification unit configured to amplify a difference of an input signal and a reference voltage and generate an output signal and an output bar signal, a current source configured to control an amount of current flowing through the differential amplification unit, and a current control unit configured to control an amount of current of the current source based on a level of the input signal.

10 Claims, 9 Drawing Sheets

DIFFERENTIAL AMPLIFIER CIRCUIT

CROSS-REFERENCE TO RELATED APPLICATIONS

The present application claims priority of Korean Patent Application No. 10-2012-0062122, filed on Jun. 11, 2012, which is incorporated herein by reference in its entirety.

BACKGROUND

1. Field

Exemplary embodiments of the present invention relate to a differential amplifier circuit, and more particularly, to a technology for improving asymmetry of output signals in a differential amplifier circuit (a buffer circuit) that receives pseudo-differential input signals.

2. Description of the Related Art

FIG. 1 is a circuit diagram illustrating a conventional differential amplifier circuit 100.

Referring to FIG. 1, the conventional differential amplifier circuit 100 includes a differential amplification unit 110 and a current source 120.

The differential amplification unit 110 amplifies a voltage difference between an input terminal A and an input bar terminal B and generates an output signal OUT and an output bar signal OUTB. The current source 120 controls a constant amount of current to flow through the differential amplification unit 110.

FIGS. 2A and 2B are diagrams illustrating waveforms of output signals OUT and OUTB according to waveforms of input signals input to the input terminals A and B of the differential amplifier circuit 100.

Referring to FIG. 2A, an input signal IN is input to the input terminal A and an input bar signal INB obtained by inverting the input signal IN is input to the input terminal B. Such an input is called fully-differential input. Since the fully-differential input signals IN and INB have symmetric waveforms, the output signals OUT and OUTB of the differential amplifier circuit 100 also have symmetric waveforms, similarly to the input signals IN and INB.

Referring to FIG. 2B, an input signal is input to the input terminal A and a reference voltage VREF is input to the input terminal B. Such an input is called pseudo-differential input. The pseudo-differential input signals IN and VREF have asymmetric waveforms because the reference voltage VREF is not oscillated, and the output signals OUT and OUTB of the differential amplifier circuit 100 also have asymmetric waveforms. Particularly a swing width of the output signal OUT is narrower than that of the output bar signal OUTB, which may results in the generation of signal distortion, such as amplitude (DC) distortion, time (AC) distortion, or a duty error, in a circuit using the output signal OUT and the output bar signal OUTB at a rear stage of the differential amplifier circuit 100.

In order to alleviate the concern illustrated in FIG. 2B, the fully-differential input is used. However, since some of integrated circuit chips may not receive differential input signals and may receive only single-ended input signals in many cases, the use of the pseudo-differential input is required.

The paper 'Single-Ended Transceiver Design Techniques for 5.33 Gb/s Graphics Application' (ISCCC 2009/SESSION 7/DRAM/7.5), which is published by Hamid Partovi and the like as a study for resolving concerns arising when pseudo-differential input signals are input to a differential amplifier circuit, has proposed the addition of a compensation capacitor between an input terminal A and a common node C of the differential amplifier circuit. However, since the use of the compensation capacitor shows an actual effect only when an input signal IN is changed to an ultrahigh frequency and a swing level of an output signal is not constantly maintained, it is does not resolve the above concerns completely.

SUMMARY

Exemplary embodiments of the present invention are directed to a differential amplifier circuit capable of providing symmetric output signals while receiving pseudo-differential input signals.

Exemplary embodiments of the present invention are also directed to a differential amplifier circuit capable of providing symmetric output signals in a low frequency domain as well as a high frequency domain.

In accordance with an embodiment of the present invention, a differential amplifier circuit may include a differential amplification unit configured to amplify a difference of an input signal and a reference voltage and generate an output signal and an output bar signal, a current source configured to control an amount of current flowing through the differential amplification unit, and a current control unit configured to control an amount of current of the current source based on a level of the input signal.

In accordance with another embodiment of the present invention, a differential amplifier circuit may include a first load between a power supply voltage terminal and a first output node, a second load between the power supply voltage terminal and a second output node, a first transistor configured to form a current path between the first output node and a common node in response to an input signal, a second transistor configured to form a current path between the second output node and the common node in response to a reference voltage, a current source configured to sink current from the common node in response to a control voltage, and a current control unit configured to generate the control voltage in response to a voltage level of the first output node and a voltage level of the second output node.

In accordance with another embodiment of the present invention, a differential amplifier circuit may include a current source configured to source current to a common node in response to a control voltage, a first transistor configured to form a current path between a first output node and the common node in response to an input signal, a second transistor configured to form a current path between a second output node and the common node in response to a reference voltage, and a current control unit configured to generate the control voltage in response to a voltage level of the first output node and a voltage level of the second output node.

According to the present invention, the amount of current flowing through the differential amplifier circuit is changed based on the level of input data to adjust driving force of a differential amplifier. Consequently, although pseudo-differential input signals are input to the differential amplifier circuit, output signals having symmetrical waveforms may be generated.

DETAILED DESCRIPTION

Figure 1:
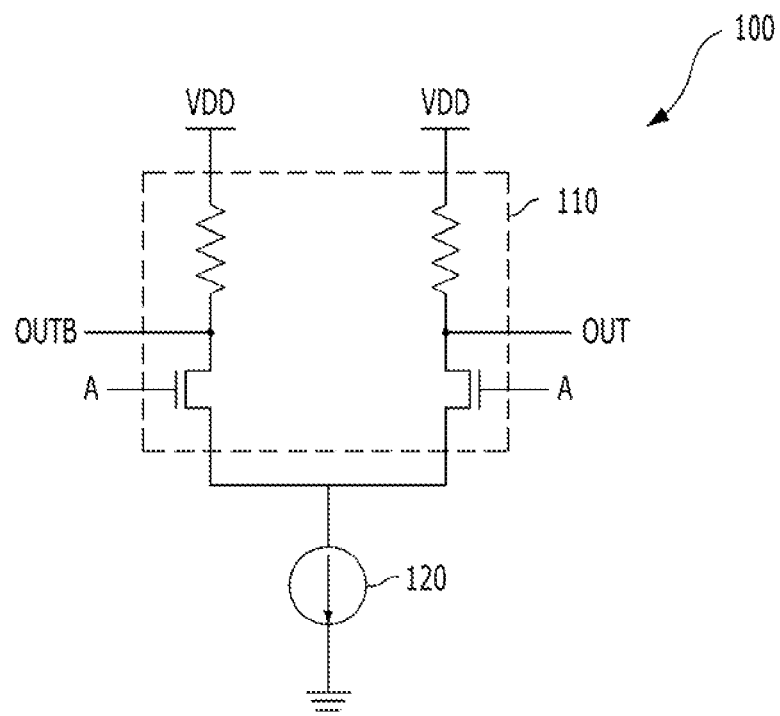
FIG. 1 is a circuit diagram illustrating a conventional differential amplifier circuit 100.
Figure 2A:
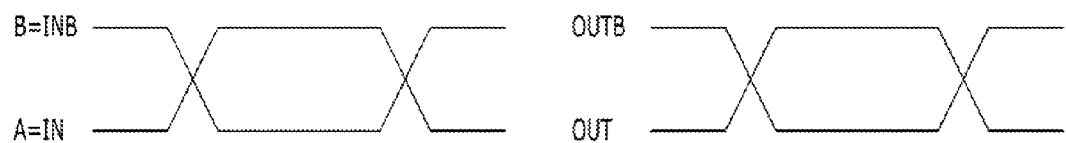
FIGS. 2A and 2B are diagrams illustrating waveforms of output signals OUT and OUTB according to waveforms of input signals input to input terminals A and B of a differential amplifier circuit 100.
Figure 2B:
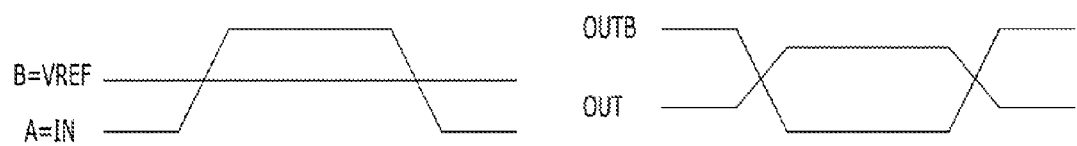

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In this specification, 'connected/coupled' represents that one component is directly coupled to another component or indirectly coupled through another component. In addition, a singular form may include a plural form as long as it is not specifically mentioned in a sentence.

Figure 3:
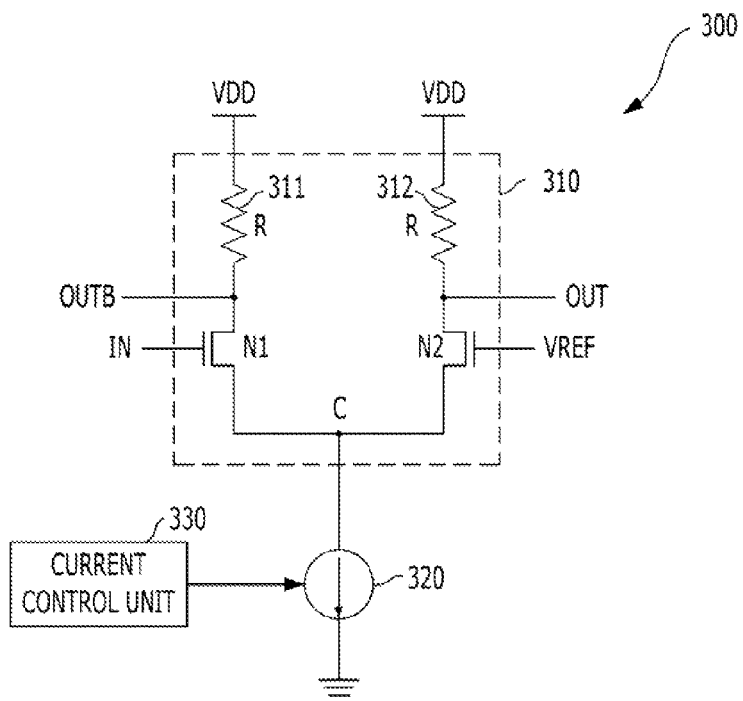
FIG. 3 is a circuit diagram of a differential amplifier circuit 300 in accordance with an embodiment of the present invention.

FIG. 3 is a circuit diagram illustrating a differential amplifier circuit 300 in accordance with an embodiment of the present invention.

Referring to FIG. 3, the differential amplifier circuit 300 includes a differential amplification unit 310, a current source 320, and a current control unit 330. The differential amplification unit 310 is configured to amplify a difference of an input signal IN and a reference voltage VREF and generate an output signal OUT and an output bar signal OUTB. The current source 320 is configured to control the amount of current flowing through the differential amplification unit 310. The current control unit 330 is configured to control the amount of current of the current source 320 based on the level of the input signal IN.

The differential amplification unit 310 includes a load 311 between a power supply voltage terminal VDD and an output bar node OUTB, a load 312 between the power supply voltage terminal VDD and an output node OUT, a transistor N1 for forming a current path between the output bar node OUTB and a common node C in response to the input signal IN, and a transistor N2 for forming a current path between the output node OUT and the common node C in response to the reference voltage VREF. The differential amplification unit 310 receives the input signal IN and the reference voltage VREF using the NMOS transistors N1 and N2, wherein such a differential amplification unit 310 is called a NMOS type.

The current source 320 is configured to adjust the amount of current consumed from the differential amplification unit 310 to a ground terminal VSS and to control the amount of current flowing through the differential amplification unit 310.

The current control unit 330 is configured to control the amount of current of the current source 320 based on the level of the input signal IN. As the input signal IN has a high level, the current control unit 330 reduces the amount of current flowing through the current source 320. As the input signal IN has a low level, the current control unit 330 increases the amount of current flowing through the current source 320.

The reason that the waveforms of output signals OUT and OUTB have asymmetric to each other in a differential amplification unit that receives the pseudo-differential input signals IN and VREF is because a swing width of the input signal IN is large but the reference voltage VREF substantially maintains a constant level. Since the transistor N1 operates by the input signal IN that is largely swung, the output bar node OUTB may be strongly driven. However, since the transistor N2 operates by the reference voltage VREF that substantially maintains a constant level, the output node OUT may not be strongly driven.

However, according to the present invention, when the input signal IN has a level higher than that of the reference voltage VREF, that is, when the output bar node OUTB is driven by the input signal IN, the amount of current flowing through the differential amplification unit 310 is reduced, so that the output bar node OUTB is relatively weakly driven. However, when the input signal IN has a level lower than that of the reference voltage VREF, that is, when the output node OUT is driven by the reference voltage VREF, the amount of current flowing through the differential amplification unit 310 is increased, so that the output node OUT is strongly driven.

That is, according to the present invention, in response to the input signals IN and VREF that are asymmetrically input, the differential amplifier circuit 300 asymmetrically operates in directions opposite to those of the input signals IN and VREF. Consequently, output signals OUT and OUTB having symmetric waveforms may be generated.

Figure 4:
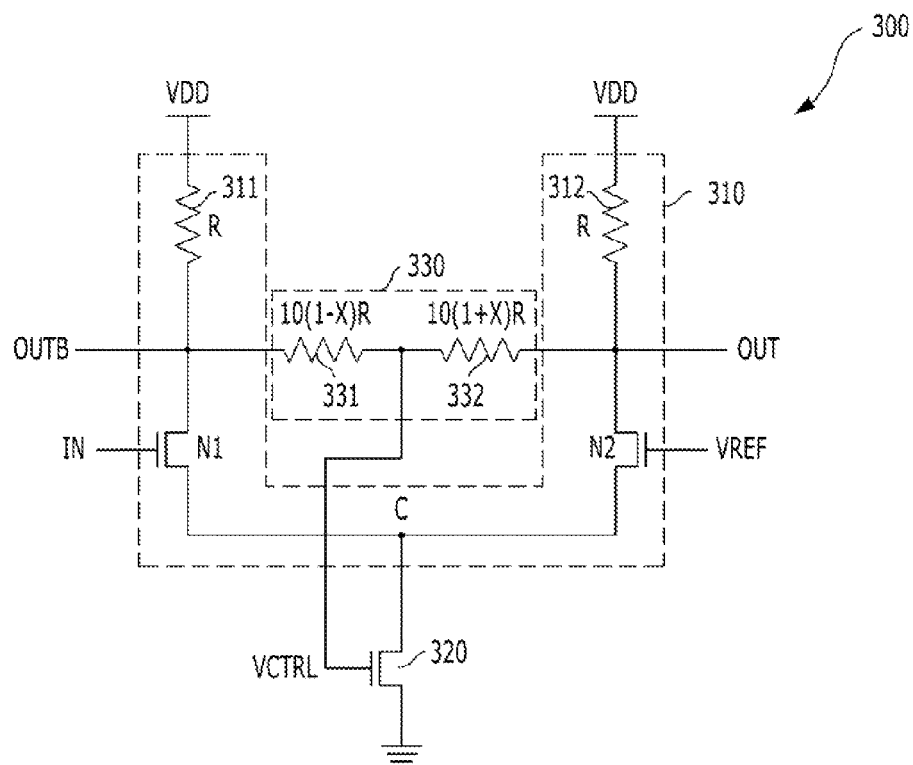
FIG. 4 is a circuit diagram of FIG. 3 according to a first detailed embodiment.

FIG. 4 is a circuit diagram of FIG. 3 according to a first detailed embodiment. With reference to FIG. 4, a detailed embodiment of the current control unit 330 and the current source 320 will be described.

The current control unit 330 generates control voltage VCTRL using the voltage levels of the output node OUT and the output bar node OUTB. The current control unit 330 includes resistors 331 and 332 for dividing the voltage of the output node OUT and the voltage of the output bar node OUTB. The resistor 332 has a resistance value higher than that of the resistor 331. Since the current control unit 330 is only an element for generating the control voltage VCTRL and does not cause a change in the voltage levels of the output node OUT and the output bar node OUTB, the resistors 331 and 332 have very high resistance values. In FIG. 4, the resistor 331 has a resistance value of $10(1-X)R$ and the resistor 332 has a resistance value of $10(1+X)R$ (X is a natural number smaller than 1). However, this is for illustrative purposes only. The resistance values of the resistors 331 and 332 may be changed such that the current control unit 330 has no influence on the voltage levels of the output node OUT and the output bar node OUTB. That is, it is sufficient if the resistors 331 and 332 of the current control unit 330 are designed to have resistance values much higher than those of the resistors 311 and 312, and the resistor 332 is designed to have a resistance value higher than that of the resistor 331.

When the input signal IN has a high level, the voltage of the output bar node OUTB is reduced and the voltage of the output node OUT is increased. Furthermore, when the input signal IN has a low level, the voltage of the output bar node OUTB is increased and the voltage of the output node OUT is reduced. Thus, when the input signal IN has a high level, the level of the control voltage VCTRL is reduced, and when the input signal IN has a low level, the level of the control voltage VCTRL is increased. As a consequence, the level of the control voltage VCTRL is determined based on the level of the input signal IN.

The current source 320 includes a NMOS transistor for sinking current from the common node C by controlling the control voltage VCTRL. When the control voltage VCTRL is high, the current source 320 sinks a large amount of current, and when the control voltage VCTRL is low, the current source 320 sinks a small amount of current. Thus, when the input signal IN has a high level, the current source 320 sinks a small amount of current, and when the input signal IN has a low level, the current source 320 sinks a large amount of current.

Figure 5:
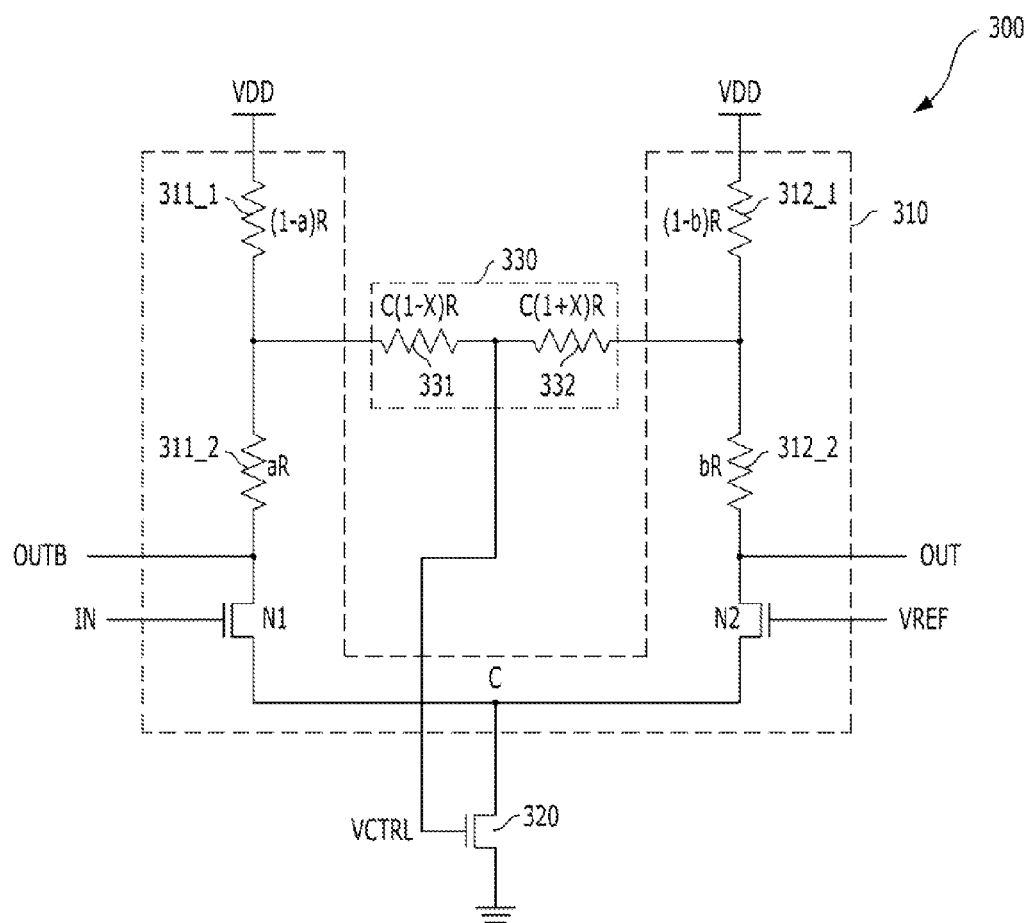
FIG. 5 is a circuit diagram of FIG. 3 according to a second detailed embodiment.

FIG. 5 is a circuit diagram of FIG. 3 according to a second detailed embodiment.

With reference to FIG. 5, a detailed embodiment of the current control unit 330 and the current source 320 will be described together with another embodiment of the differential amplification unit 310.

The loads 311 and 312 of the differential amplification unit 310 in FIG. 3 are divided into two loads 311_1 and 311_2 and two loads 312_1 and 312_2, respectively, in FIG. 5. The current control unit 330 divides a voltage of an intermediate node between the loads 311_1 and 311_2 and a voltage of an intermediate node between the loads 312_1 and 312_2, and generates the control voltage VCTRL. Furthermore, the current source 320 includes a transistor for sinking current of the common node C in response to the control voltage VCTRL. Resistance values of the resistors 311_1, 311_2, 312_1, 312_2, 331, and 332 are as illustrated in FIG. 5. In FIG. 5, a and b are natural numbers smaller than 1 and C is a natural number equal to or greater than 5.

In FIG. 5, the internal configuration of the differential amplification unit 310 and the configuration of the current control unit 330 are modified to be different from those of FIG. 4. However, FIG. 5 illustrates substantially the same operation as that of FIG. 4 in that when the input signal IN has a high level, the current source 320 sinks a small amount of current, and when the input signal IN has a low level, the current source 320 sinks a large amount of current.

Figure 6:
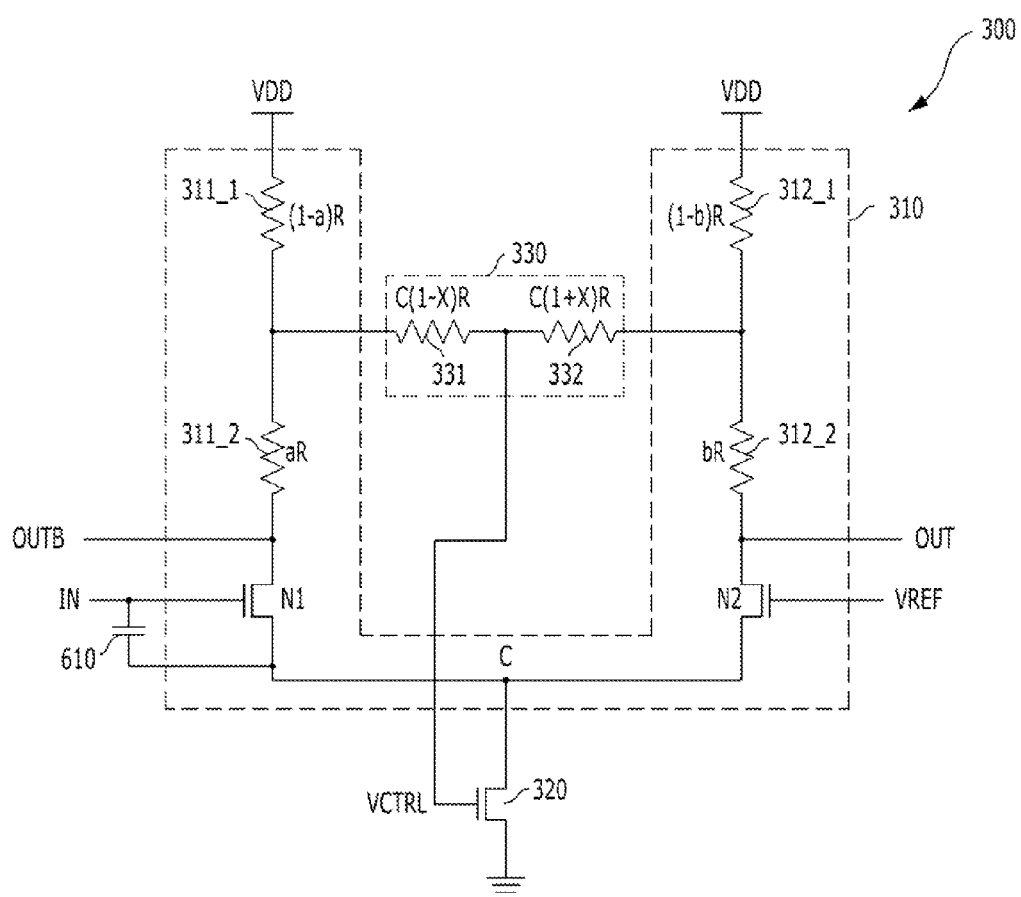
FIG. 6 is a circuit diagram of FIG. 3 according to a third detailed embodiment.

FIG. 6 is a configuration diagram of FIG. 3 according to a third detailed embodiment.

In the embodiment of FIG. 6, a compensation capacitor 610 is further provided differently from the embodiment of FIG. 4. The compensation capacitor 610 is connected between a node, to which the input signal IN is input, and the common node C.

As described in the paper published by Hamid Partovi and the like in the background art, the use of the compensation capacitor 610 is useful to ensure the symmetry of output signals when an input signal is changed to an ultrahigh frequency.

The compensation capacitor 610 may also be added in the embodiment of FIG. 5 in the same manner.

Figure 7:
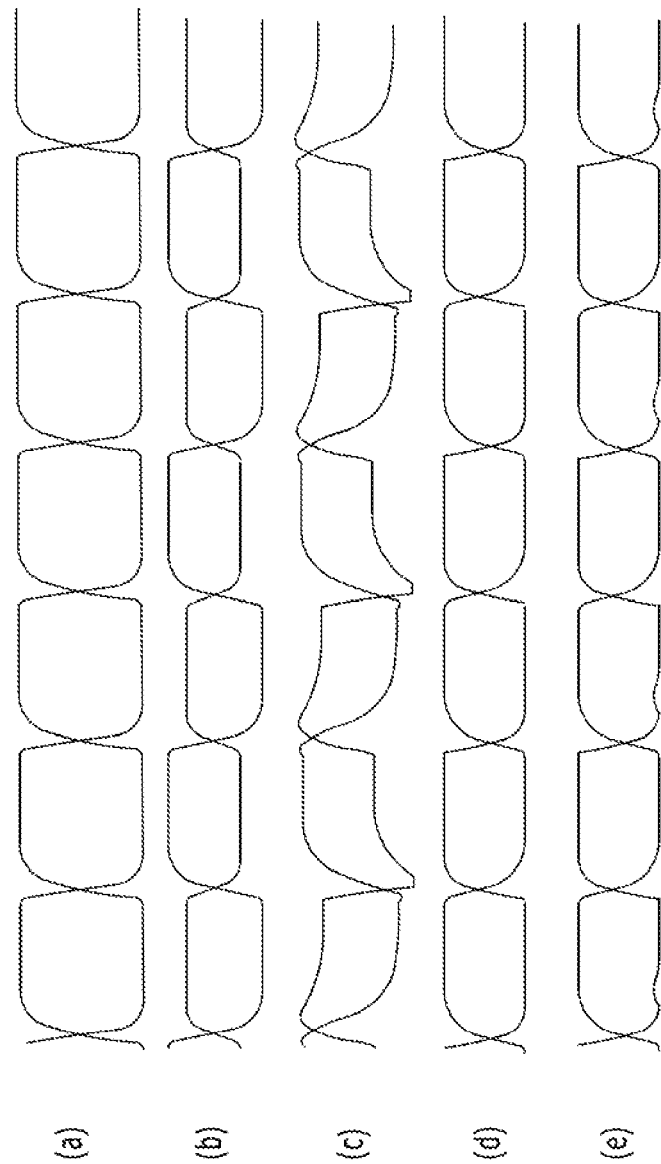
FIG. 7 is a simulation waveform diagram illustrating the operations of differential amplification units according to the present invention and the conventional art.

FIG. 7 is a simulation waveform diagram illustrating the operations of the differential amplification units according to the present invention and the conventional art. According to the simulation conditions of FIG. 7, a swing level of the input signal IN is in the range of 0.62 V to 1.02 V and a pulse width of the input signal IN is 333 pico seconds.

(a) of FIG. 7 is a waveform diagram illustrating output signals OUT and OUTB when fully-differential input signals IN and INB are input to the differential amplification unit of FIG. 1. (b) of FIG. 7 is a waveform diagram illustrating output signals OUT and OUTB when pseudo-differential input signals IN and VREF are input to the differential amplification unit of FIG. 1. (c) of FIG. 7 is a waveform diagram illustrating output signals OUT and OUTB when a compensation capacitor is added to the differential amplification unit of FIG. 1 and pseudo-differential input signals IN and VREF are input. (d) of FIG. 7 is a waveform diagram illustrating output signals OUT and OUTB when pseudo-differential input signals IN and VREF are input to the differential amplification unit of FIG. 4. (e) of FIG. 7 is a waveform diagram illustrating output signals OUT and OUTB when pseudo-differential input signals IN and VREF are input to, the differential amplification unit of FIG. 6.

Referring to FIG. 7, in (d) and (e) of the present invention, although the pseudo-differential input signals IN and VREF are input to the differential amplification unit, the waveforms of the output signals OUT and OUTB are approximately symmetrical to each other.

Figure 8:
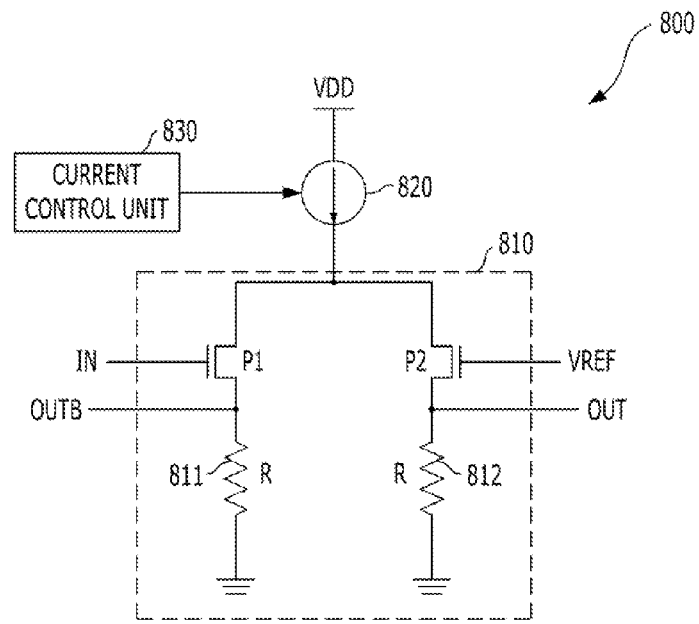
FIG. 8 is a circuit diagram of a differential amplifier circuit 800 in accordance with another embodiment of the present invention.

FIG. 8 is a circuit diagram illustrating a differential amplifier circuit 800 in accordance with another embodiment of the present invention.

Referring to FIG. 8, the differential amplifier circuit 800 includes a differential amplification unit 810, a current source 820, and a current control unit 830. The differential amplification unit 810 is configured to amplify a difference of an input signal IN and a reference voltage VREF and generate an output signal OUT and an output bar signal OUTB. The current source 820 is configured to control the amount of current flowing through the differential amplification unit 810. The current control unit 830 is configured to control the amount of current of the current source 820 based on the level of the input signal IN.

The differential amplification unit 810 includes a transistor P1 for forming a current path between an output bar node OUTB and a common node C in response to the input signal IN, a transistor P2 for forming a current path between an output node OUT and the common node C in response to the reference voltage VREF, a load 811 between the output bar node OUTB and a ground terminal, and a load 812 between the output bar node OUTB and the ground terminal. The differential amplification unit 810 receives the input signal and the reference voltage using the PMOS transistors P1 and P2, wherein such a differential amplification unit is called a PMOS type.

The current source 820 is configured to adjust the amount of current sourced from a power supply voltage terminal VDD to the common node C and to control the amount of current flowing through the differential amplification unit 810.

The current control unit 830 is configured to control the amount of current of the current source 820 based on the level of the input signal IN. When the input signal IN has a low level, the current control unit 830 reduces the amount of current flowing through the current source 820. When the input signal IN has a high level, the current control unit 830 increases the amount of current flowing through the current source 820.

The reason that the waveforms of output signals OUT and OUTB have asymmetry to each other in a differential amplification unit that receives the pseudo-differential input signals IN and VREF is because a swing width of the input signal IN is large but the reference voltage VREF substantially maintains a constant level. Since the transistor P1 operates by the input signal IN, which is largely swung, the output bar node OUTB may be strongly driven. However, since the transistor P2 operates by the reference voltage VREF that substantially maintains a constant level, the output node OUT may not be strongly driven.

However, according to the present invention, when the input signal IN has a level lower than that of the reference voltage VREF, that is, when the output bar node OUTB is driven by the input signal IN, the amount of current flowing through the differential amplification unit 810 is reduced, so that the output bar node OUTB is relatively weakly driven. However, when the input signal IN has a level higher than that of the reference voltage VREF, that is, when the output node OUT is driven by the reference voltage VREF, the amount of current flowing through the differential amplification unit 810 is increased, so that the output node OUT is strongly driven.

That is, according to the present invention, in response to the input signals IN and VREF that are asymmetrically input, the differential amplifier circuit 800 asymmetrically operates in directions opposite to those of the input signals IN and VREF. Consequently, output signals OUT and OUTB having symmetric waveforms may be generated.

Figure 9:
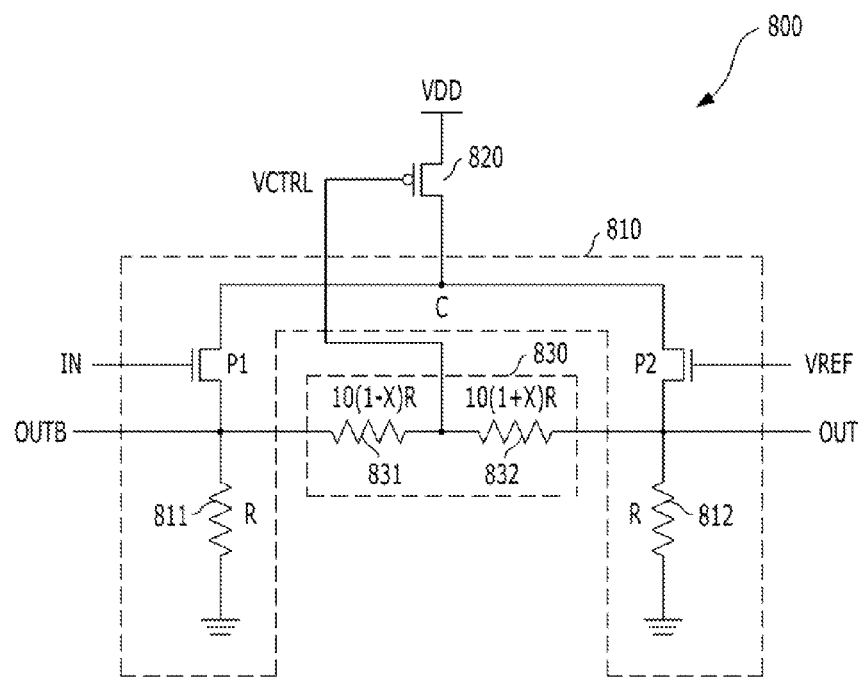
FIG. 9 is a circuit diagram of FIG. 8 according to a first detailed embodiment.

FIG. 9 is a circuit diagram of FIG. 8 according to a first detailed embodiment. With reference to FIG. 9, a detailed embodiment of the current control unit 830 and the current source 820 will be described.

The current control unit 830 generates a control voltage VCTRL using the voltage levels of the output node OUT and the output bar node OUTB. The current control unit 830 includes resistors 831 and 832 for dividing the voltage of the output node OUT and the voltage of the output bar node OUTB. The resistor 832 has a resistance value higher than that of the resistor 831. Since the current control unit 830 is only an element for generating the control voltage VCTRL and does not cause a change in the voltage levels of the output node OUT and the output bar node OUTB the resistors 831 and 832 have very high resistance values. In FIG. 9, the resistor 831 has a resistance value of 10(1−X)R and the resistor 832 has a resistance value of 10(1+X)R (X is a natural number smaller than 1). That is, the resistors 831 and 832 of the current control unit 830 are designed to have resistance values much higher than those of the resistors 811 and 812, and the resistor 832 is designed to have a resistance value higher than that of the resistor 831.

When the input signal IN has a low level, the voltage of the output bar node OUTB is increased and the voltage of the output node OUT is reduced. Furthermore, when the input signal IN has a high level, the voltage of the output bar node OUTB is reduced and the voltage of the output node OUT is increased. Thus, when the input signal IN has a low level, the level of the control voltage VCTRL is increased, and when the input signal IN has a high level, the level of the control voltage VCTRL is reduced. As a consequence, the level of the control voltage VCTRL is determined based on the level of the input signal IN.

The current source 820 includes a PMOS transistor for sourcing current from the power supply voltage terminal to the common node by controlling the control voltage VCTRL. When the control voltage VCTRL is low, the current source 820 sinks a large amount of current, and when the control voltage VCTRL is high, the current source 820 sinks a small amount of current. Thus, when the input signal IN has a low level the current source 820 sources a small amount of current, and when the input signal IN has a high level, the current source 820 sources a large amount of current.

Figure 10:
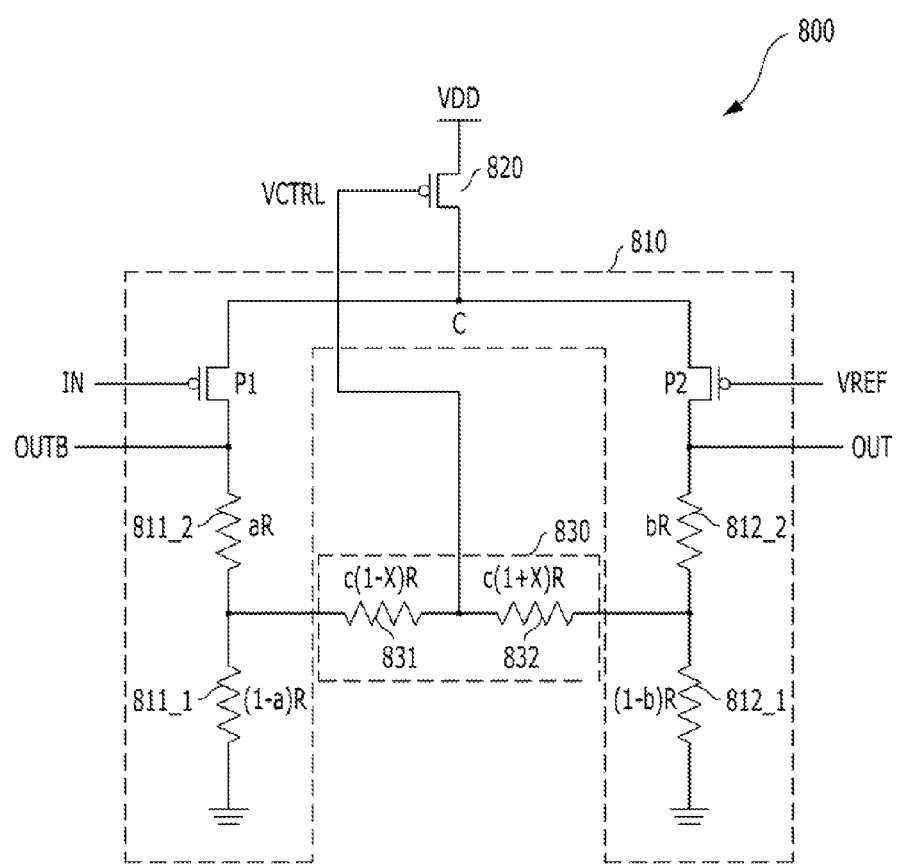
FIG. 10 is a circuit diagram of FIG. 8 according to a second detailed embodiment.

FIG. 10 is a circuit diagram of FIG. 8 according to a second detailed embodiment.

With reference to FIG. 10, a detailed embodiment of the current control unit 830 and the current source 820 will be described together with a modification example of the differential amplification unit 810.

The loads 811 and 812 of the differential amplification unit 810 in FIG. 8 are divided into two loads 811_1 and 811_2 and two loads 812_1 and 812_2, respectively, in FIG. 10. The current control unit 830 divides a voltage of an intermediate node between the loads 811_1 and 811_2 and a voltage of an intermediate node between the loads 812_1 and 812_2 and generates the control voltage VCTRL. Furthermore, the current source 820 includes a transistor for sourcing current to the common node C in response to the control voltage VCTRL. Resistance values of the resistors 811_1, 811_2, 812_1, 812_2, 831, and 832 are as illustrated in FIG. 10. In FIG. 10, a and b are natural numbers smaller than 1 and c is a natural number equal to or more than 5.

In FIG. 10, the internal configuration of the differential amplification unit 810 and the configuration of the current control unit 830 are modified to be different from those of FIG. 9. However, FIG. 10 illustrates substantially the same operation as that of FIG. 9 in that when the input signal IN has a low level, the current source 820 sources a small amount of current, and when the input signal IN has a high level, the current source 820 sources a large amount of current.

Figure 11:
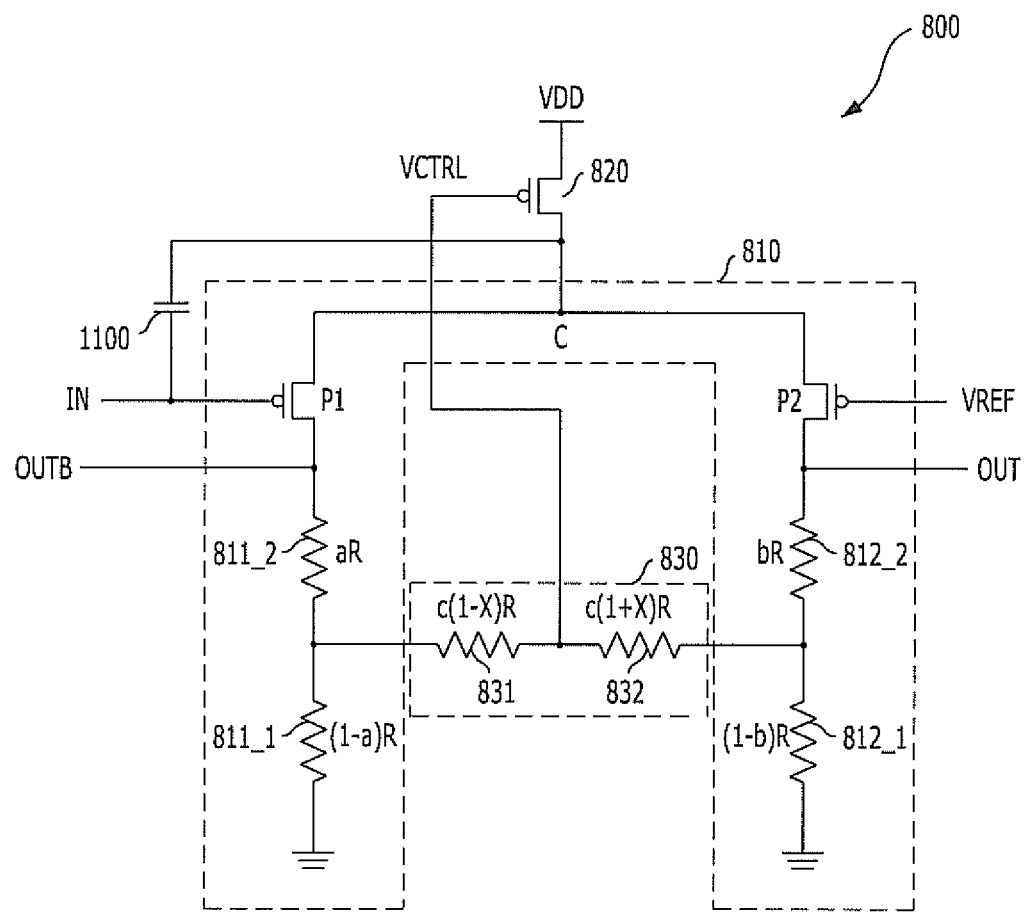
FIG. 11 is a circuit diagram of FIG. 8 according to a third detailed embodiment.

FIG. 11 is a configuration diagram of FIG. 8 according to a third detailed embodiment.

In the embodiment of FIG. 11, a compensation capacitor 1100 is further provided differently from the embodiment of FIG. 9. The compensation capacitor 1100 is connected between a node, to which the input signal IN is input, and the common node C.

While the present invention has been described with respect to the specific embodiments, it will be apparent to those skilled in the art that various changes and modifications may be made without departing from the spirit and scope of the invention as defined in the following claims.

Particularly, in the aforementioned embodiments, the examples (FIGS. 3 to 6), in which the present invention is applied to the NMOS type differential amplifier circuit, and the examples (FIGS. 8 to 11), in which the present invention is applied to the PMOS type differential amplifier circuit, have been described. However, it is of course that the present invention may be realized by a combination of these embodiments.

What is claimed is:

1. A differential amplifier circuit comprising:
   a first load between a power supply voltage terminal and a first output node;
   a second load between the power supply voltage terminal and a second output node;
   a first transistor configured to form a current path between the first output node and a common node in response to an input signal;
   a second transistor configured to form a current path between the second output node and the common node in response to a reference voltage;
   a current source configured to sink current from the common node in response to a control voltage; and
   a current control unit configured to generate the control voltage in response to a voltage level of the first output node and a voltage level of the second output node,
   wherein the current control unit comprises:
   a first resistor connected between the first output node and a control voltage terminal; and a second resistor connected between the second output node and the control voltage terminal, and having a resistance value higher than a resistance value of the first resistor.

2. The differential amplifier circuit of claim 1, wherein the current control unit is configured to divide a voltage of the first output node and a voltage of the second output node and to generate the control voltage.

3. The differential amplifier circuit of claim 1, further comprising:
a capacitor connected between a gate of the first transistor and the common node.

4. A differential amplifier circuit comprising:
a current source configured to source current to a common node in response to a control voltage;
a first transistor configured to form a current path between a first output node and the common node in response to an input signal;
a second transistor configured to form a current path between a second output node and the common node in response to a reference voltage; and
a current control unit configured to generate the control voltage in response to a voltage level of the first output node and a voltage level of the second output node,
wherein the current control unit comprises:
a first resistor connected between the first output node and a control voltage terminal; and
a second resistor connected between the second output node and the control voltage terminal, and having a resistance value higher than a resistance value of the first resistor.

5. The differential amplifier circuit of claim 4, wherein the current control unit is configured to divide a voltage of the first output node and a voltage of the second output node and to generate the control voltage.

6. The differential amplifier circuit of claim 4, further comprising:
a capacitor connected between a gate of the first transistor and the common node.

7. A differential amplifier circuit comprising:
a first load between a power supply voltage terminal and a first node;
a second load between the first node and a first output node;
a third load between the power supply voltage terminal and a second node;
a fourth load between the second node and a second output node;
a first transistor configured to form a current path between the first output node and a common node in response to an input signal;
a second transistor configured to form a current path between the second output node and the common node in response to a reference voltage;
a current source configured to sink current from the common node in response to a voltage of a control voltage terminal;
a first resistor connected between the first node and the control voltage terminal; and
a second resistor connected between the second node and the control voltage terminal, and having a resistance value higher than a resistance value of the first resistor.

8. The differential amplifier circuit of claim 7, further comprising:
a capacitor connected between a gate of the first transistor and the common node.

9. A differential amplifier circuit comprising:
a current source configured to source current to a common node in response to a voltage of a control voltage terminal;
a first transistor configured to form a current path between a first output node and the common node in response to an input signal;
a second transistor configured to form a current path between a second output node and the common node in response to a reference voltage;
a first load between the first output node and a first node;
a second load between the first node and a ground;
a third load between the second output node and a second node;
a fourth load between the second node and the ground;
a first resistor connected between the first node and the control voltage terminal;
a second resistor connected between the second node and the control voltage termonal, and having a resistance value higher than a resistor value of the first resistor.

10. The differential amplifier circuit of claim 9, further comprising:
a capacitor connected between a gate of a first resistor and the common node.

* * * * *